United States Patent
Chen et al.

(10) Patent No.: US 12,525,522 B2
(45) Date of Patent: Jan. 13, 2026

(54) PACKAGE STRUCTURE AND METHOD FOR MANUFACTURING THE SAME

(71) Applicant: Unimicron Technology Corp., Taoyuan (TW)

(72) Inventors: Jyun-Hong Chen, Taoyuan (TW); Chi-Hai Kuo, Taoyuan (TW); Pu-Ju Lin, Hsinchu (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 622 days.

(21) Appl. No.: 18/053,748

(22) Filed: Nov. 8, 2022

(65) Prior Publication Data

US 2024/0128179 A1  Apr. 18, 2024

(30) Foreign Application Priority Data

Oct. 12, 2022 (TW) .................. 111138710

(51) Int. Cl.
*H01L 23/48* (2006.01)
*H01L 21/48* (2006.01)
(Continued)

(52) U.S. Cl.
CPC .... *H01L 23/49833* (2013.01); *H01L 21/4853* (2013.01); *H01L 21/4857* (2013.01);
(Continued)

(58) Field of Classification Search
CPC ........... H01L 23/49833; H01L 21/4853; H01L 21/4857; H01L 21/486; H01L 23/13; H01L 23/145; H01L 23/3737; H01L 23/3738; H01L 23/49816; H01L 23/49822; H01L 23/49838; H01L 24/16; H01L 25/105; H01L 25/50; H01L 2224/16235; H01L 2225/1023; H01L 2225/1035; H01L 2225/1041; H01L 2225/107;
(Continued)

(56) References Cited

U.S. PATENT DOCUMENTS

2016/0293534 A1  10/2016 Shen et al.
2019/0343017 A1* 11/2019 Eid .......................... H01L 24/17
(Continued)

FOREIGN PATENT DOCUMENTS

CN  106910736 A  6/2017
TW  I372588 B  9/2012
(Continued)

*Primary Examiner* — Theresa T Doan
(74) *Attorney, Agent, or Firm* — CKC & Partners Co., LLC

(57) ABSTRACT

A package structure includes a first substrate, a second substrate disposed on the first substrate, a third substrate disposed on the second substrate, and multiple chips mounted on the third substrate. A second coefficient of thermal expansion (CTE) of the second substrate is less than a first CTE of the first substrate. The third substrate includes a first sub-substrate, a second sub-substrate in the same level with the first sub-substrate, a third sub-substrate in the same level with the first sub-substrate. A CTE of the first sub-substrate, a CTE of the second sub-substrate, and a CTE of the third sub-substrate are less than the second CTE of the second substrate.

9 Claims, 16 Drawing Sheets

(51) Int. Cl.
*H01L 23/00* (2006.01)
*H01L 23/13* (2006.01)
*H01L 23/14* (2006.01)
*H01L 23/373* (2006.01)
*H01L 23/498* (2006.01)
*H01L 23/52* (2006.01)
*H01L 25/00* (2006.01)
*H01L 25/10* (2006.01)

(52) U.S. Cl.
CPC ............ *H01L 21/486* (2013.01); *H01L 23/13* (2013.01); *H01L 23/145* (2013.01); *H01L 23/3737* (2013.01); *H01L 23/3738* (2013.01); *H01L 23/49816* (2013.01); *H01L 23/49822* (2013.01); *H01L 23/49838* (2013.01); *H01L 24/16* (2013.01); *H01L 25/105* (2013.01); *H01L 25/50* (2013.01); *H01L 2224/16235* (2013.01); *H01L 2225/1023* (2013.01); *H01L 2225/1035* (2013.01); *H01L 2225/1041* (2013.01); *H01L 2225/107* (2013.01); *H01L 2225/1094* (2013.01); *H01L 2924/1011* (2013.01); *H01L 2924/1431* (2013.01); *H01L 2924/1434* (2013.01); *H01L 2924/1461* (2013.01); *H01L 2924/3511* (2013.01)

(58) Field of Classification Search
CPC ..... H01L 2225/1094; H01L 2924/1011; H01L 2924/1431; H01L 2924/1434; H01L 2924/1461; H01L 2924/3511; H01L 23/15; H01L 2225/06517; H01L 2225/0652; H01L 2225/06555; H01L 2225/06572; H01L 23/5384; H01L 23/5385; H01L 25/0652; H01L 25/0655; H01L 23/5389
USPC .......................................................... 257/690
See application file for complete search history.

(56) References Cited

U.S. PATENT DOCUMENTS

2020/0219789 A1\* 7/2020 Uppal ................. H01L 21/4882
2022/0262751 A1 8/2022 Zhang et al.

FOREIGN PATENT DOCUMENTS

TW 201535622 A 9/2015
TW 202234636 A 9/2022

\* cited by examiner

PACKAGE STRUCTURE AND METHOD FOR MANUFACTURING THE SAME

RELATED APPLICATIONS

This application claims priority to Taiwanese Application Serial Number 111138710, filed Oct. 12, 2022, which is herein incorporated by reference.

BACKGROUND

Field of Invention

The present invention relates to a package structure and a method for manufacturing the same.

Description of Related Art

Various materials are applied in a semiconductor package. Due to a mismatch of coefficient of thermal expansion (CTE) among the various materials, a thermal stresses induced by a later thermal process such as reflow process causes warpage. Reliability of the semiconductor package is subject to warpage.

SUMMARY

An aspect of the disclosure provides a package structure. The package structure includes a first substrate having a first coefficient of thermal expansion (CTE), a second substrate disposed on the first substrate and having a second CTE, a third substrate disposed on the second substrate, and a plurality of chips disposed on the third substrate. The second CTE is smaller than the first CTE. The third substrate includes a first sub-substrate, a second sub-substrate located in a same level with the first sub-substrate, and a third sub-substrate located in the same level with the first sub-substrate. A CTE of the first sub-substrate, a CTE of the second sub-substrate, and a CTE of the third sub-substrate are all less than the second CTE of the second substrate.

According to some embodiments of the disclosure, the package structure further includes a redistribution layer disposed on the third substrate and connected to the first sub-substrate, the second sub-substrate, and the third sub-substrate.

According to some embodiments of the disclosure, the chips include a first chip, a second chip, and a third chip. A CTE of the first chip is greater than a CTE of the second chip. The CTE of the first chip is greater than a CTE of the third chip. The CTE of the first sub-substrate is greater than the CTE of the second sub-substrate. The CTE of the first sub-substrate is greater than the CTE of the third sub-substrate. The first sub-substrate is laterally surrounded by the second sub-substrate and the third sub-substrate. The first chip is disposed on the first sub-substrate.

According to some embodiments of the disclosure, the CTE of the second chip is greater than the CTE of the third chip. The CTE of the second sub-substrate is greater than the CTE of the third sub-substrate. The second chip is disposed on the second sub-substrate. The third chip is disposed on the third sub-substrate.

According to some embodiments of the disclosure, the package structure further includes an embedded chip embedded in the second substrate, and the first sub-substrate is disposed between the first chip and the embedded chip.

According to some embodiments of the disclosure, an area of the first sub-substrate is greater than an area of the first chip, and the area of the first sub-substrate is greater than an area of the embedded chip.

According to some embodiments of the disclosure, there is a difference between CTEs of the chips and the first CTE, and the CTE of the first sub-substrate, the CTE of the second sub-substrate, or the CTE of the third sub-substrate is 40% to 60% of the difference.

According to some embodiments of the disclosure, there is a difference between CTEs of the chips and the first CTE, and the second CTE is 65% to 85% of the difference.

According to some embodiments of the disclosure, the chips include a first chip, a second chip, and a third chip. A size of the first chip is greater than a size of the second chip. The size of the first chip is greater than a size of the third chip. A CTE of the first chip is greater than a CTE of the second chip. The CTE of the first chip is greater than a CTE of the third chip. The first chip is disposed on the first sub-substrate. The second chip is disposed on the second sub-substrate. The third chip is disposed on the third sub-substrate.

Another aspect of the disclosure provides a method for manufacturing a package structure. The method includes providing a second substrate, wherein the second substrate has a second coefficient of thermal expansion (CTE); forming a first conductive via in the second substrate; providing a first sub-substrate, a second sub-substrate, and a third sub-substrate, wherein a CTE of the first sub-substrate, a CTE of the second sub-substrate, and a CTE of the third sub-substrate are all less than the second CTE; forming a second conductive via in the first sub-substrate, the second sub-substrate, and the third sub-substrate; laterally assembling the first sub-substrate, the second sub-substrate, and the third sub-substrate into a third substrate; vertically assembling the second substrate and the third substrate on a first substrate, wherein the second substrate is disposed between the first substrate and the third substrate; and mounting a first chip, a second chip, and a third chip on the third substrate.

According to some embodiments of the disclosure, the method further includes forming a redistribution layer on the third substrate, wherein the first sub-substrate, the second sub-substrate, and the third sub-substrate are connected to the redistribution layer.

According to some embodiments of the disclosure, laterally assembling the first sub-substrate, the second sub-substrate, and the third sub-substrate includes arranging the second sub-substrate and the third sub-substrate surrounding the first sub-substrate, wherein the CTE of the first sub-substrate is greater than the CTE of the second sub-substrate and is greater than the CTE of the third sub-substrate.

According to some embodiments of the disclosure, mounting a first chip, a second chip, and a third chip on the third substrate includes mounting the first chip on the first sub-substrate; mounting the second chip on the second sub-substrate; and mounting the third chip on the third sub-substrate. A size of the first chip is greater than a size of the second chip and is greater than a size of the third chip.

According to some embodiments of the disclosure, mounting a first chip, a second chip, and a third chip on the third substrate includes mounting the first chip on the first sub-substrate; mounting the second chip on the second sub-substrate; and mounting the third chip on the third sub-substrate. The CTE of the first chip is greater than the CTE of the second chip and is greater than the CTE of the third chip.

According to some embodiments of the disclosure, The method further includes forming an opening in the second substrate; placing an embedded chip in the opening; and prior to vertically assembling the second substrate and the third substrate on a first substrate, making an active surface of the embedded chip facing the third substrate.

According to some embodiments of the disclosure, making an active surface of the embedded chip facing the third substrate includes making the active surface of the embedded chip facing the first sub-substrate. A projection of the embedded chip on the first sub-substrate is completely within an area of the first sub-substrate, and a projection of the first chip on the first sub-substrate is completely within the area of the first sub-substrate.

According to some embodiments of the disclosure, the CTE of the first sub-substrate, the CTE of the second sub-substrate, and the CTE of the third sub-substrate are in a range from 4 ppm/° C. to 9 ppm/° C., respectively.

According to some embodiments of the disclosure, the second CTE of the second substrate is in a range from 9 ppm/° C. to 13 ppm/° C.

According to some embodiments of the disclosure, a CTE of the first substrate is in a range from 15 ppm/° C. to 18 ppm/° C.

The embodiments of the disclosure couple (e.g. laterally assemble) and stack (e.g. vertically assemble) substrates with different CTEs to reduce the gaps of CTE mismatch in the package structure, thereby preventing the problem of warpage in the package structure.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
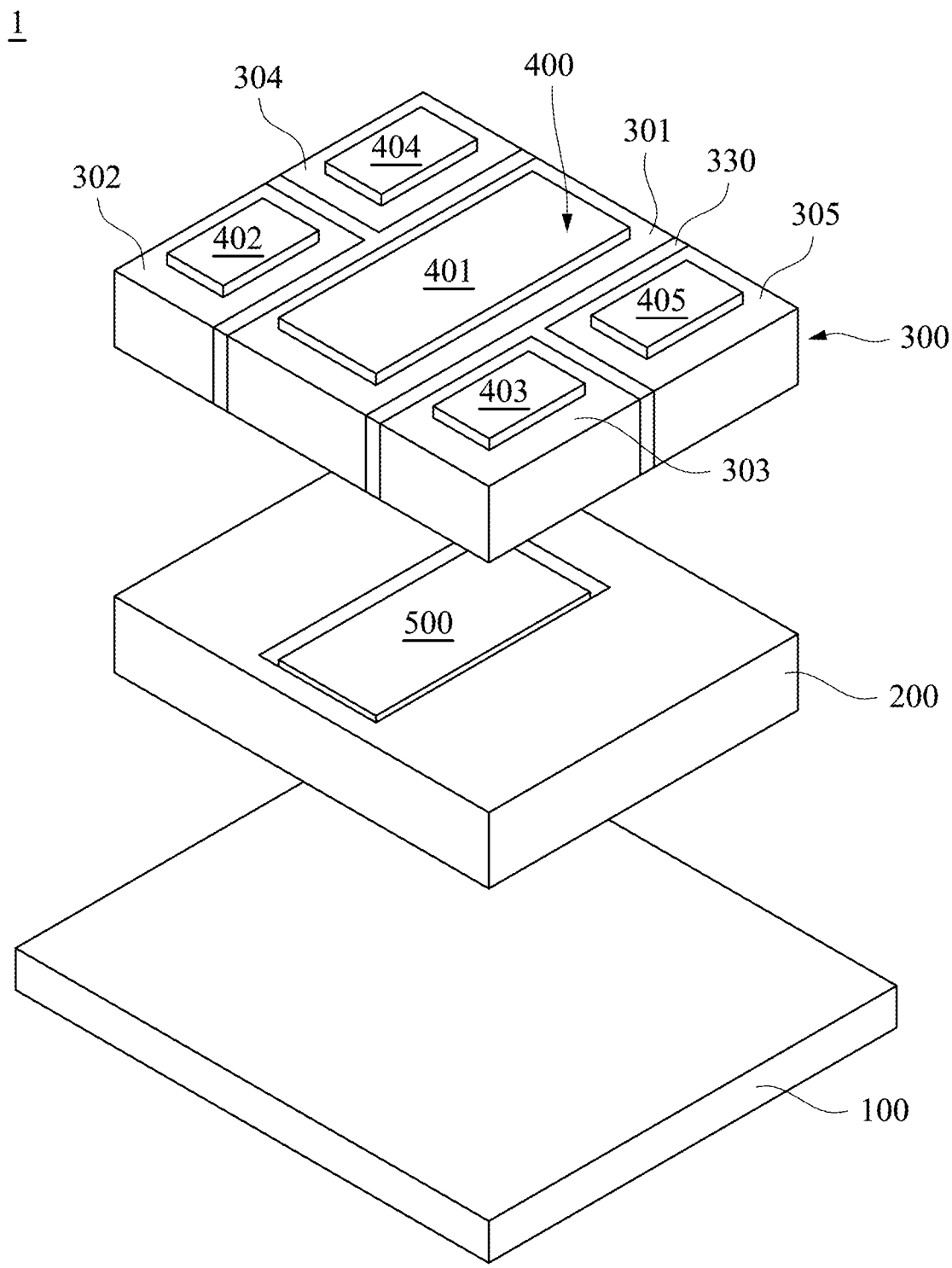
FIG. 1 is an explosion view of a package structure according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In recent 2.5C/3D package technique, warpage issues are generally controlled by anti-warpage mechanism such as stiffener rings or capped lids to against the stress. These designs not only increase package sizes but also increase design and manufacture costs. In some cases, a through glass via (TGV) substrate is introduced in the package structure to solve the warpage issue in the package structure. The TGV substrate has benefits of adjustable coefficient of thermal expansion (CTE), fast signal transmission speed, great power efficiency, etc. However, the TGV substrate is difficult to be utilized in a vertically stacked high density package structure. The embodiments of the disclosure couple (e.g. laterally assemble) and stack (e.g. vertically assemble) substrates with different CTEs to reduce the gaps of CTE mismatch in the package structure, thereby preventing the problem of warpage in the package structure.

Reference is made to FIG. 1, in which FIG. 1 is an explosion view of a package structure 1 according to some embodiments of the disclosure. It is noted that the features in FIG. 1 may be simplified and therefore cannot completely match the structure illustrated in the following drawings such as drawings after FIG. 3A. The package structure 1 includes a first substrate 100, a second substrate 200 disposed on the first substrate 100, and a third substrate 300 disposed on the second substrate 200. The third substrate 300 is formed by assembling a plurality of sub-substrates. For example, as shown in FIG. 1, the third substrate 300 includes a first sub-substrate 301, a second sub-substrate 302, a third sub-substrate 303, a fourth sub-substrate 304, and a fifth sub-substrate 305, but the disclosure is not limited thereto. Namely, the first sub-substrate 301, the second sub-substrate 302, the third sub-substrate 303, the fourth sub-substrate 304, and the fifth sub-substrate 305 are located in the same level. The first sub-substrate 301, the second sub-substrate 302, the third sub-substrate 303, the fourth sub-substrate 304, and the fifth sub-substrate 305 are laterally assembled as the third substrate 300. Additionally, the sub-substrates of the third substrate 300 can be connected to each other by using an adhesion 330. In some embodiments, top surfaces of the first sub-substrate 301, the second sub-substrate 302, the third sub-substrate 303, the fourth sub-substrate 304, and the fifth sub-substrate 305 can be coplanar, to further improve the reliability of mounting chips on the third substrate 300 in the following processes.

The package structure 1 further includes a plurality of chips 400. The chips 400 are disposed on the third substrate 300. The chips 400 can be chips of different functions, such as a logic chip, a memory chip, a micro-electromechanical system (MEMS) chip, a chiplet, or other system on chip (SOC). The disclosure is not limited thereto. The chips 400 includes a first chip 401, a second chip 402, a third chip 403, a fourth chip 404, and a fifth chip 405 disposed on the corresponding sub-substrates, respectively, such as respectively on the first sub-substrate 301, the second sub-substrate 302, the third sub-substrate 303, the fourth sub-substrate 304, and the fifth sub-substrate 305.

The first substrate 100 has a first CTE measured in a lateral direction. In some embodiments, the first CTE is in a range from about 15 ppm/° C. to 18 ppm/° C. Generally, CTEs of the chips 400 are smaller than the first CTE. In some embodiments, the CTEs of the chips 400 are about 3 ppm/° C. Therefore, there is a difference between the first CTE of the first substrate 100 and the CTEs of the chips 400. In some embodiments, the CTE difference between the first substrate 100 and the chips 400 is in a range from about 12 ppm/° C. to 15 ppm/° C.

The first substrate 100 includes a dielectric material. The dielectric material can include liquid crystal polymer (LCP), bismaleimide-triazine (BT), prepreg, resin with inorganic filler (e.g., Ajinomoto Build-up Film (ABF)), epoxy, polyimide (PI), or other suitable material, but the present disclosure is not limited thereto. Additionally, the aforementioned material may be further blended with fibers such as glass fibers or Kevlar fibers, to raise the strength of the first substrate 100. Conductive wires (not shown) are formed in the first substrate 100.

The second substrate 200 has a second CTE that is less than the first CTE and is greater than the CTEs of the chips 400. More particularly, the second CTE of the second substrate 200 can be about 65% to 85% of the CTE difference between the first substrate 100 and the chips 400. In some embodiments, the second CTE of the second substrate 200 is in a range from about 9 ppm/° C. to 13 ppm/° C.

The second substrate 200 can be a glass substrate, a ceramic substrate, a silicon interposer, or other suitable material. Also, the composition and CTE of the glass substrate or the ceramic substrate can be tuned by using a doping process, such that the second CTE of the second substrate 200 can be tuned within the desired range. For example, the glass substrate of the second substrate 200 can be a soda lime silica glass which includes a silicon oxide, a metal oxide (e.g. calcium oxide, magnesium oxide, aluminum oxide, sodium oxide, or the like), or suitable dopants. In some other embodiments, the material of the ceramic substrate of the second substrate 200 can be aluminum oxide, aluminum nitride, aluminum oxynitride, magnesium oxide, silicon nitride, silicon oxide, silicon oxynitride, gallium oxide, germanium oxide, yttrium oxide, zirconium oxide, lanthanum oxide, neodymium oxide, hafnium oxide, tantalum oxide, aluminosilicate, other suitable materials, or the combinations thereof.

The CTE of the third substrate 300 is less than the second CTE of the second substrate 200. For example, the CTE of the first sub-substrate 301, the CTE of the second sub-substrate 302, the CTE of the third sub-substrate 303, the CTE of the fourth sub-substrate 304, and the CTE of the fifth sub-substrate 305 are all less than the second CTE of the second substrate 200. More particularly, the CTE of the third substrate 300 can be about 40% to 60% of the CTE difference between the first substrate 100 and the chips 400. As described in the embodiment illustrated in FIG. 1, the CTE of the first sub-substrate 301, the CTE of the second sub-substrate 302, the CTE of the third sub-substrate 303, the CTE of the fourth sub-substrate 304, and the CTE of the fifth sub-substrate 305 are about 40% to 60% of the CTE difference between the first substrate 100 and the chips 400, respectively.

In some embodiments, the CTE of the third substrate 300 is in a range from about 4 ppm/° C. to 9 ppm/° C. As described in the embodiment illustrated in FIG. 1, the CTE of the first sub-substrate 301, the CTE of the second sub-substrate 302, the CTE of the third sub-substrate 303, the CTE of the fourth sub-substrate 304, and the CTE of the fifth sub-substrate 305 are in a range from about 4 ppm/° C. to 9 ppm/° C., respectively.

Each of the sub-substrates of the third substrate 300 can be the glass substrate, the ceramic substrate, the silicon interposer, or other suitable materials. Also, the composition and CTE of the glass substrate or the ceramic substrate can be tuned by using a doping process, such that the CTEs of the sub-substrates of the third substrate 300 can be tuned within the desired range. For example, the glass substrate of the sub-substrates of the third substrate 300 can be borosilicate glass which includes an oxynitride, a boron oxide, a metal oxide (e.g. calcium oxide, magnesium oxide, aluminum oxide, sodium oxide, or the like), or suitable dopants. In some other embodiments, the material of the ceramic substrate of the sub-substrates of the third substrate 300 can be silicon nitride, silicon carbide, aluminum oxide, aluminum nitride, aluminum oxynitride, aluminosilicate, other suitable materials, or the combinations thereof.

The materials of the second substrate 200 and the third substrate 300 are chosen to meet the desired CTE ranges. The second substrate 200 and the third substrate 300 are sequentially stacked (vertically assembled) on the first substrate 100 such that the second substrate 200 and the third substrate 300 are disposed between the first substrate 100 and the chips 400. Basically, the CTE distribution of the package structure 1 sequentially decreases from the first substrate 100, the second substrate 200, the third substrate 300, to the chips 400. By inserting the second substrate 200 and the third substrate 300 between the first substrate 100 and the chips 400, the CTE mismatch between the first substrate 100 and the chips 400 becomes unobvious. Namely, the package structure 1 includes substrates with different CTEs, in which the CTE difference between adjacent two of the substrates is less than the CTE difference between the topmost substrate and the bottommost substrate, thereby reducing the possibility of warpage issue in the structure.

Additionally, according to different chip package requirements, the CTE of each of the sub-substrate of the third substrate 300 can be further adjusted accordingly, as long as the CTE of each of the sub-substrate of the third substrate 300 is within the desired CTE range of the third substrate 300 such as in a range from about 4 ppm/° C. to 9 ppm/° C. Generally, the CTEs of the chips are positively correlated with the CTEs of the sub-substrates of which assembled thereon. Namely, the greater the CTEs of the chips, the greater the corresponding CTEs of the sub-substrates are. The CTEs of the sub-substrates are chosen according to the chips assembled thereon, such that the possibility of warpage can be reduced, and the package density can be further increased.

For example, the first chip 401 may have the greatest among the chips 400 of FIG. 1. That is, the CTE of the first chip 401 is greater than the CTEs of second chip 402, the third chip 403, the fourth chip 404, and the fifth chip 405, respectively, and the first chip 401, the second chip 402, the third chip 403, the fourth chip 404, and the fifth chip 405 are mounted on the first sub-substrate 301, the second sub-substrate 302, the third sub-substrate 303, the fourth sub-substrate 304, and the fifth sub-substrate 305, respectively. In this embodiment, the first sub-substrate 301 has the greatest among the sub-substrates of the third substrate 300. The CTE of the first sub-substrate 301 is greater than the CTE of the second sub-substrate 302, the CTE of the third sub-substrate 303, the CTE of the fourth sub-substrate 304, and the CTE of the fifth sub-substrate 305, respectively. The first chip 401 having the greatest CTE among the chips 400 is mounted on the first sub-substrate 301 having the greatest CTE among the sub-substrates.

In some embodiments, the chip having greater CTE such as the first chip 401 is disposed at the center region, and the chips having smaller CTEs such as the second chip 402, the third chip 403, the fourth chip 404, and the fifth chip 405 are disposed at the peripheral region and are laterally surrounding the first chip 401.

Similarly, the sub-substrate having greater CTE such as the first sub-substrate 301 is disposed at the center region, and the sub-substrates having smaller CTEs such as the second sub-substrate 302, the third sub-substrate 303, the fourth sub-substrate 304, and the fifth sub-substrate 305 are disposed at the peripheral region and are laterally surrounding the first sub-substrate 301.

In yet other embodiments, the CTE of the second chip 402 is greater than the CTE of the third chip 403, and the second sub-substrate 302 mounted with the second chip 402 has the CTE greater than the CTE of the third sub-substrate 303 mounted with the third chip 403. The fourth chip 404, the fifth chip 405, the fourth sub-substrate 304, and the fifth sub-substrate 305 can be mounted in a similar manner. The combinations and the CTE correlations of the sub-substrates of the third substrate 300 and the chip 400 can be adjusted based on the disclosure of the previous embodiments.

In some embodiments, the chips 400 have substantially the same CTEs, the chip of the chips 400 with larger size such as the first chip 401 of FIG. 1 is disposed at the center region, and the chips having smaller sizes such as the second chip 402, the third chip 403, the fourth chip 404, and the fifth chip 405 are disposed at the peripheral region and are laterally surrounding the first chip 401, to secure the stability of the assembled third substrate 300.

The package structure 1 further includes an embedded chip 500, in which the embedded chip 500 is embedded in the second substrate 200 to further improve the package density. In some embodiments, the embedded chip 500 can be a logic circuit chip. As shown in the embodiment illustrated in FIG. 1, the first sub-substrate 301 is disposed between the first chip 401 and the embedded chip 500. In some embodiments, the area of the first sub-substrate 301 is greater than the area of the first chip 401 and is also greater than the area of the embedded chip 500 in order to provide sufficient structural support and increase the footprint for later electrical connection. That is, the projection of the first chip 401 on the first sub-substrate 301 is completely within the area of the first sub-substrate 301, and the projection of the embedded chip 500 on the first sub-substrate 301 is completely within the area of the first sub-substrate 301.

Figure 2:
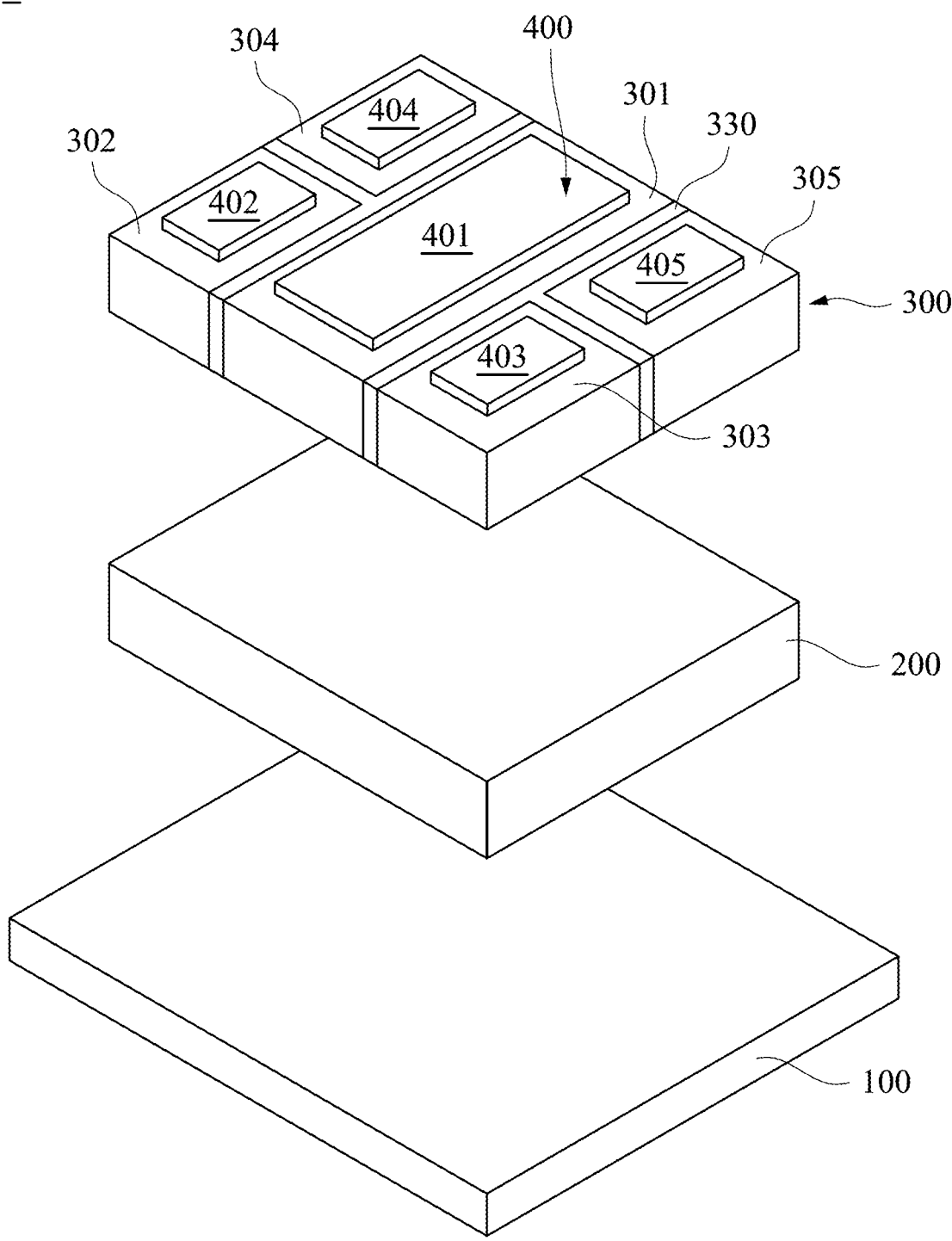
FIG. 2 is an explosion view of the package structure according to some other embodiments of the disclosure.

Reference is made to FIG. 2. FIG. 2 is an explosion view of the package structure 2 according to some other embodiments of the disclosure. It is noted that the features in FIG. 1 may be simplified and therefore cannot completely match the structure illustrated in the following drawings such as drawings after FIG. 3A. The package structure 2 in FIG. 2 is much similar to the package structure 1 in FIG. 1, and the main difference therebetween is that the package structure 2 does not include the embedded component in the second substrate 200.

Figure 3A:
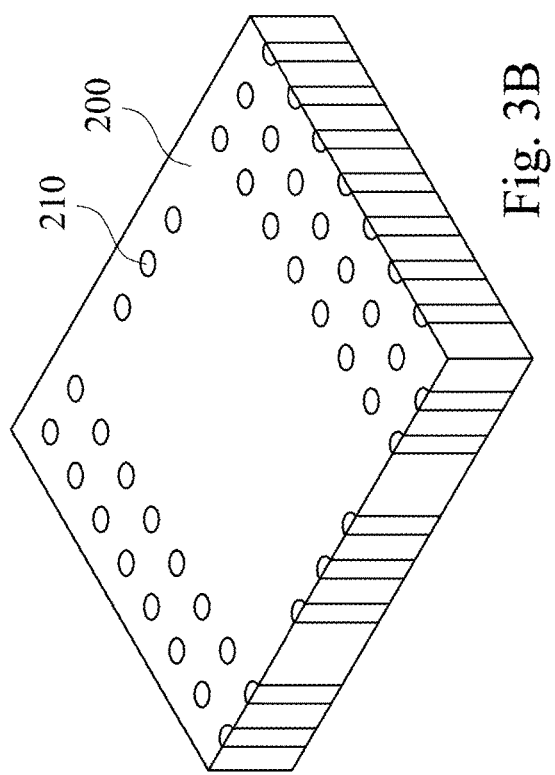
FIG. 3A to FIG. 3D are schematic views of different stages of manufacturing the second substrate of the package structure according to some embodiments of the disclosure.
Figure 3B:
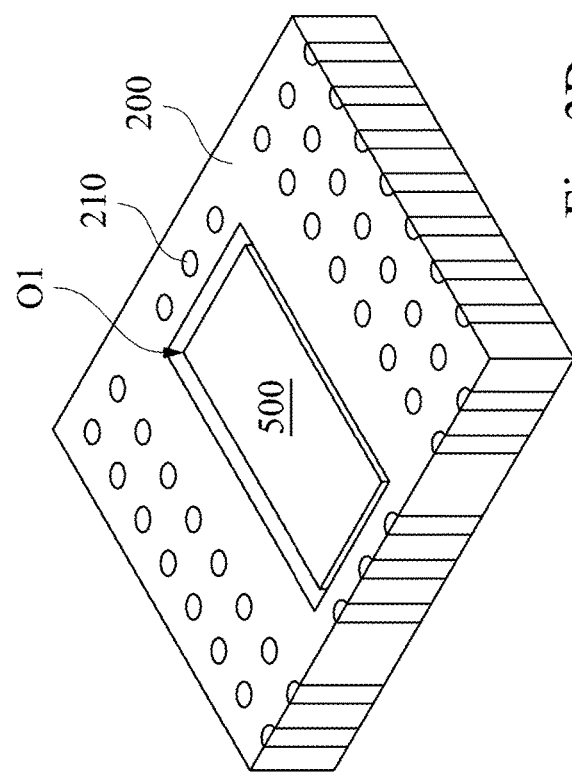
Figure 3C:
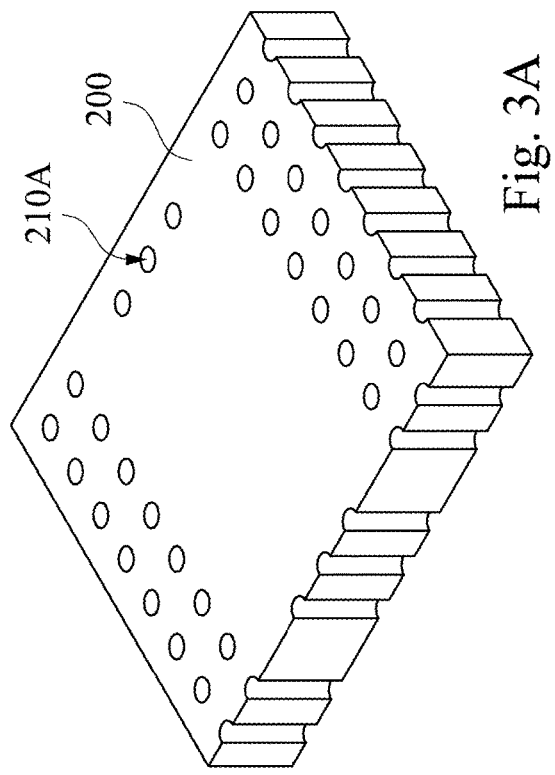
Figure 3D:
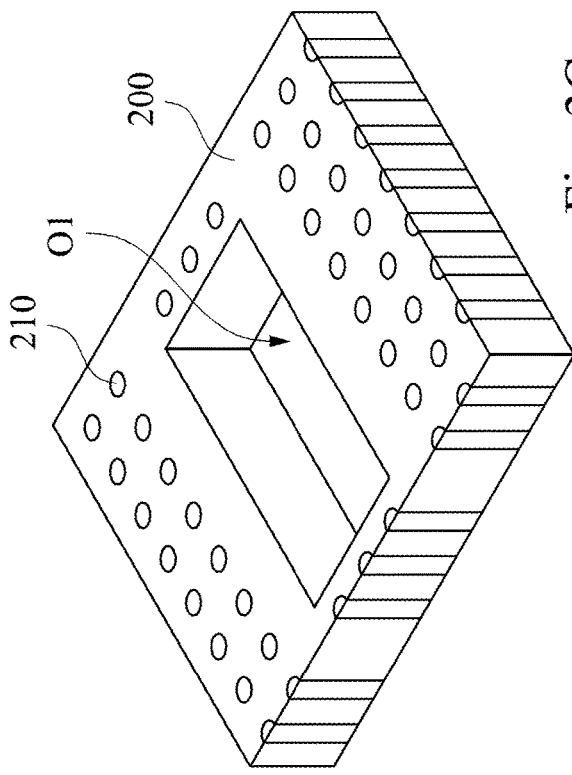
Figure 4A:
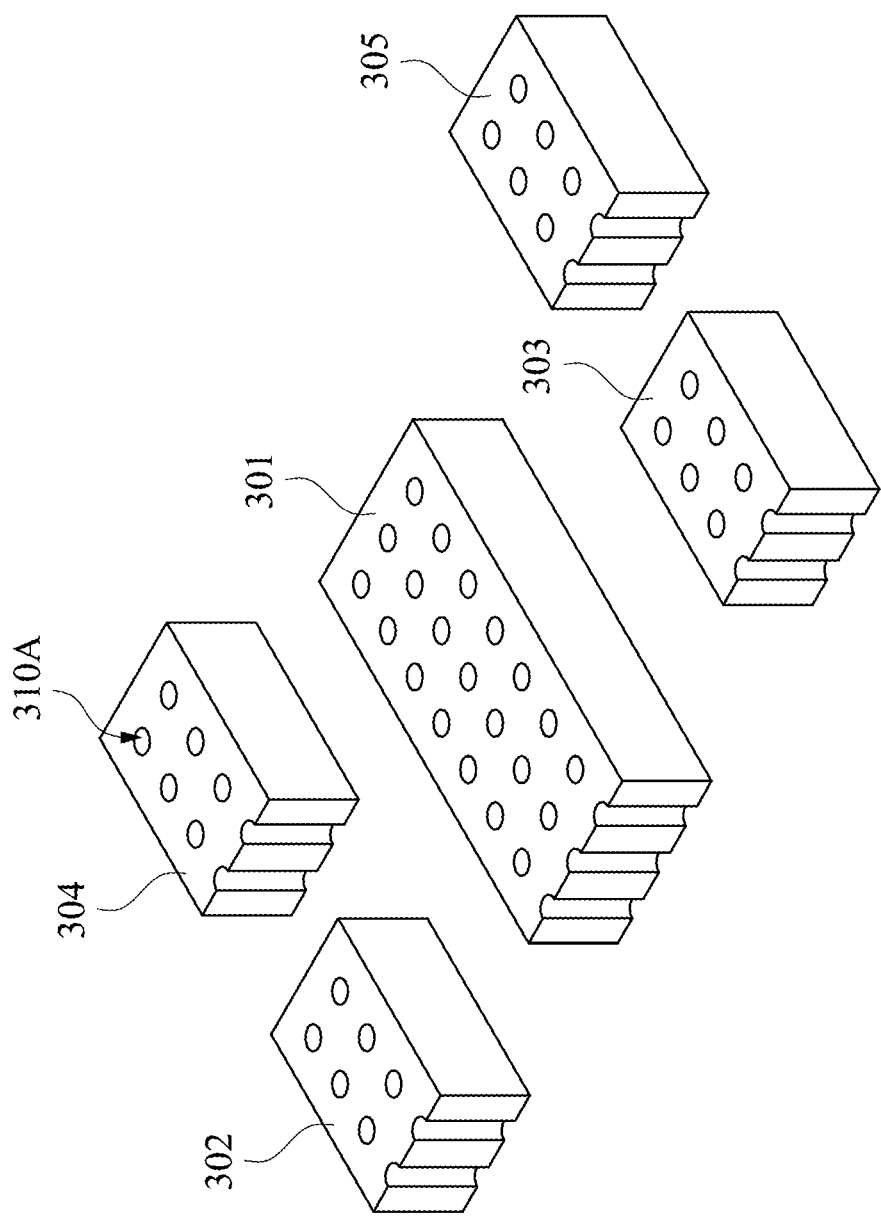
FIG. 4A to FIG. 4E are schematic views of different stages of manufacturing the third substrate of the package structure according to some embodiments of the disclosure.
Figure 4B:
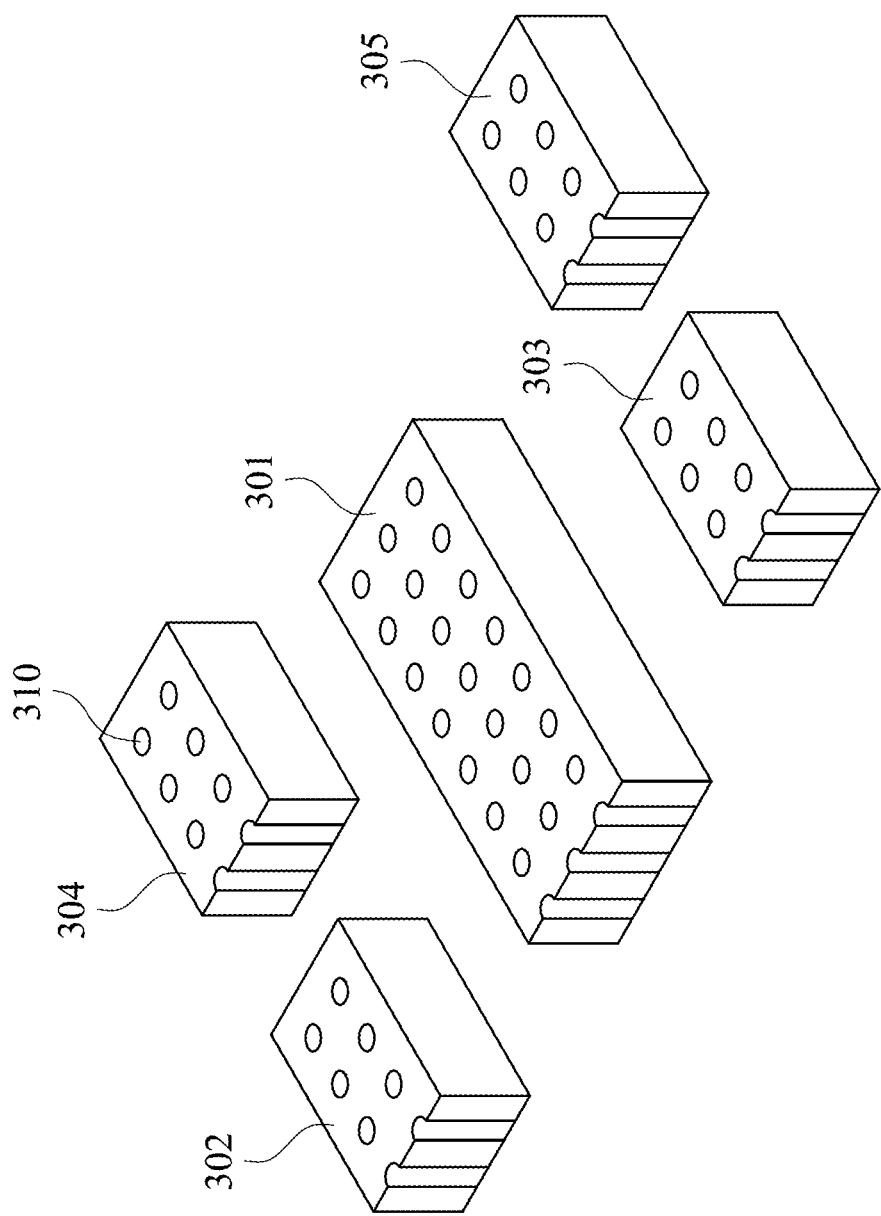
Figure 4D:
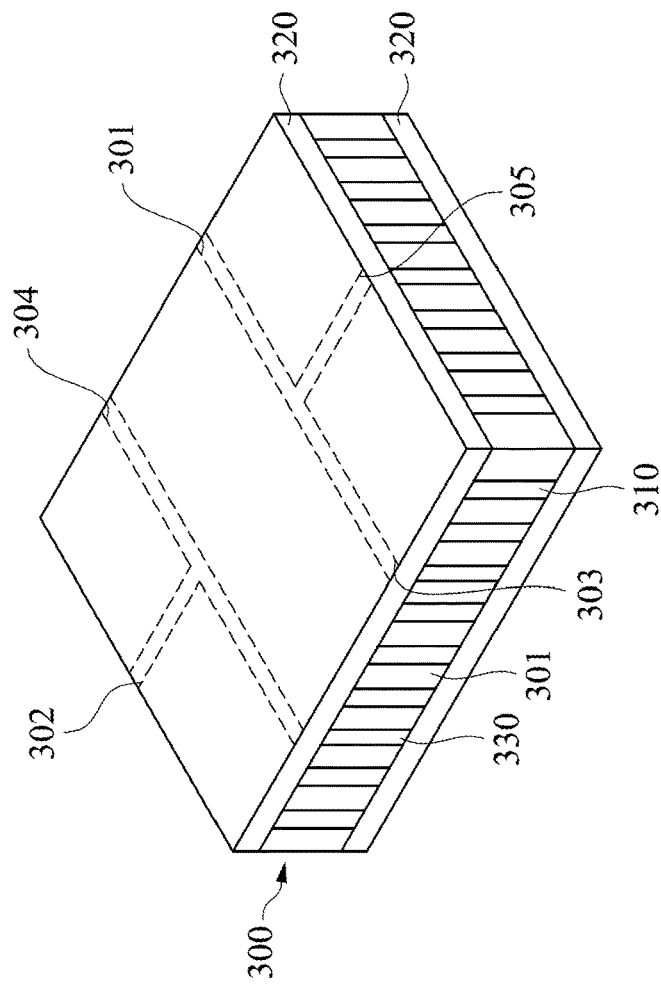
Figure 4C:
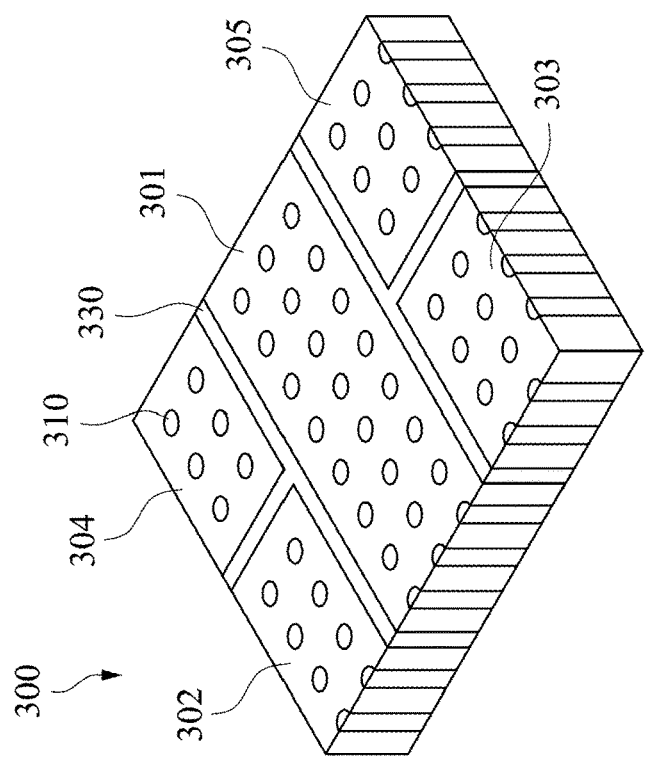
Figure 4E:
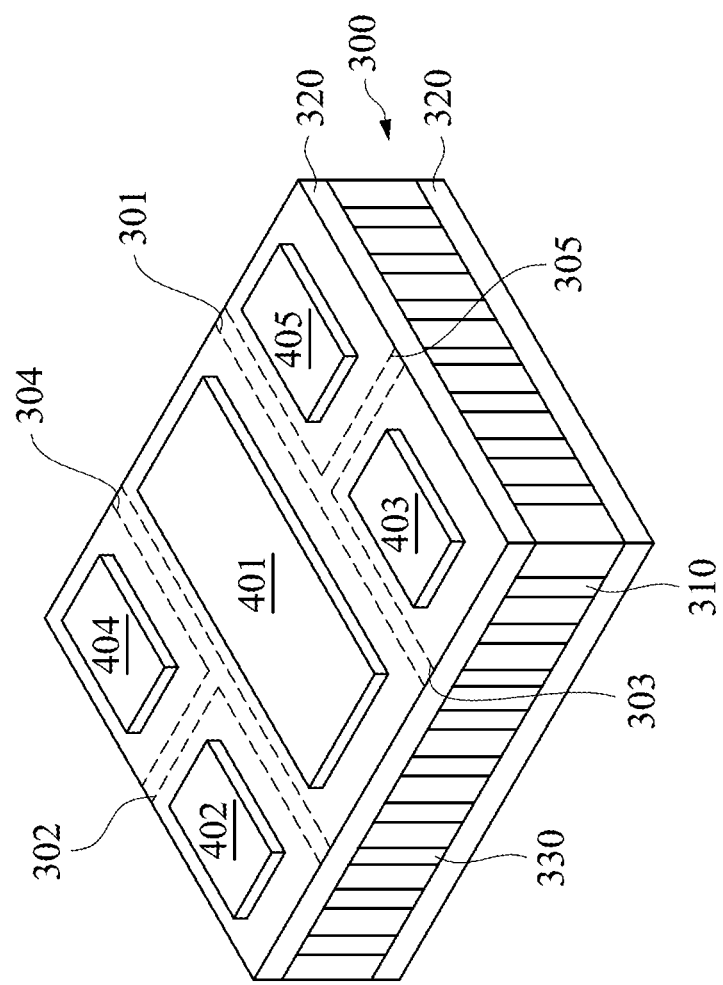
Figure 5:
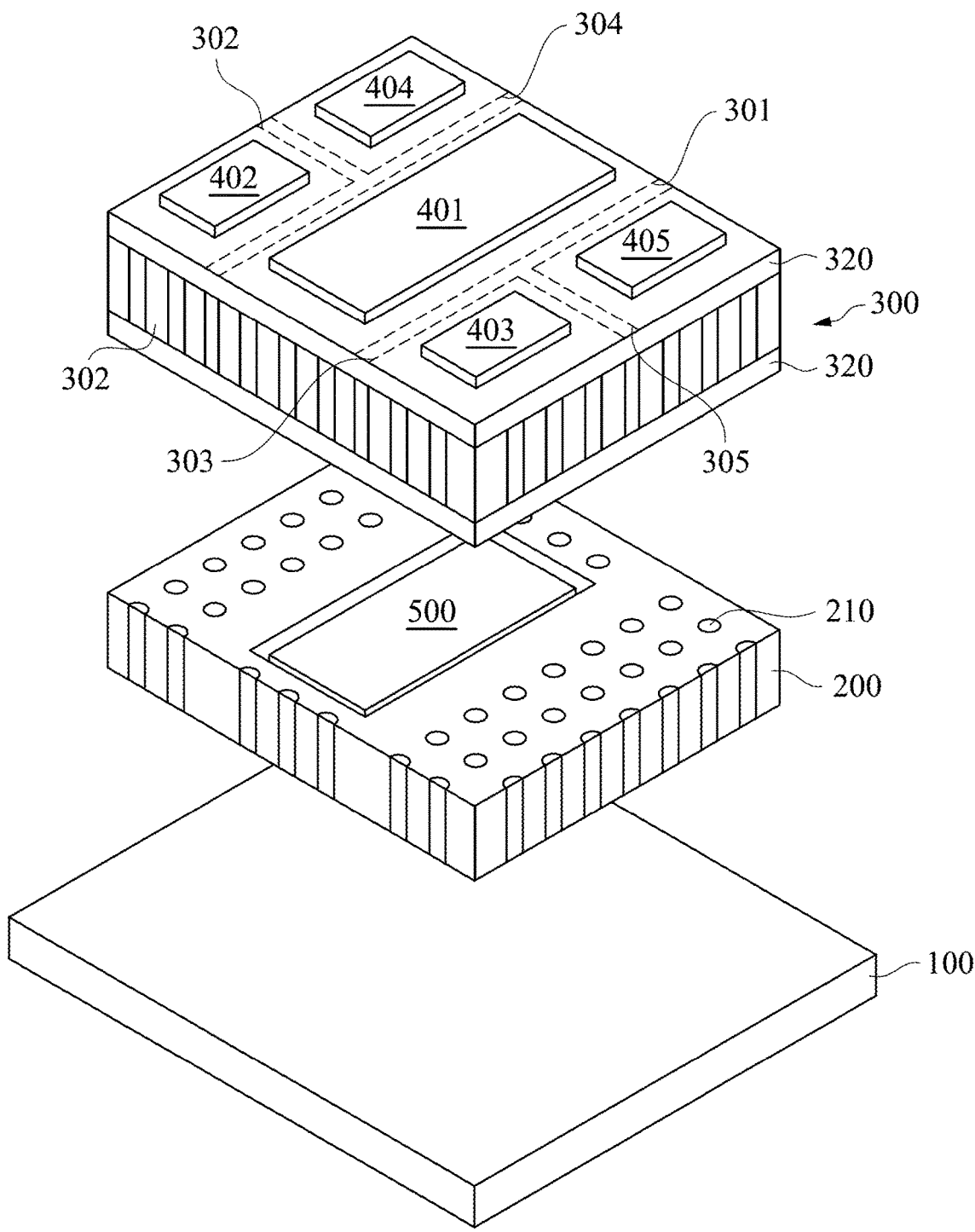
FIG. 5 is a schematic view of one stage of manufacturing the package structure according to some embodiments of the disclosure.

FIG. 3A to FIG. 3D, FIG. 4A to FIG. 4E, and FIG. 5 are schematic views of different stages of manufacturing the package structure 1 according to some embodiments of the disclosure. FIG. 3A to FIG. 3D are schematic views of different stages of manufacturing the second substrate 200 of the package structure 1 according to some embodiments of the disclosure. FIG. 4A to FIG. 4E are schematic views of different stages of manufacturing the third substrate 300 of the package structure 1 according to some embodiments of the disclosure. FIG. 5 is a schematic view of one stage of manufacturing the package structure 1 according to some embodiments of the disclosure.

Unless otherwise illustrated, the order in which some or all of the operations are described should not be construed to imply that these operations are necessarily order dependent. Alternative ordering will be appreciated having the benefit of this description. Additional operations can be provided before, during, and/or after these operations to complete the formation, and may be briefly described herein. Further, it will be understood that not all operations are necessarily present in each embodiment provided herein. Also, it will be understood that not all operations are necessary in some embodiments.

Reference is made to FIG. 3A. The second substrate 200 is provided, and a plurality of vias 210A are formed in the second substrate 200. The vias 210A penetrate through opposite sides of the second substrate 200. The vias 210A can be formed by performing a laser drilling process, a deep reactive ion etching (DRIE) process, other suitable technique, or the combinations thereof. The second substrate 200 has the second CTE.

Reference is made to FIG. 3B. The conductive vias 210 are formed in the second substrate 200. The conductive vias 210 can be formed by performing an evaporation process, a sputtering process, a chemical plating process, an electroplating process, other suitable deposition process, or the combinations thereof.

Reference is made to FIG. 3C. An opening O1 is formed in the second substrate 200. The second substrate 200 can be formed by performing a routing process, a mechanical drilling process, a laser drilling process, an etching process, other suitable deposition process, or the combinations thereof.

Reference is made to FIG. 3D. The embedded chip 500 is placed in the opening O1 such that the embedded chip 500 is embedded in the second substrate 200. In some embodiments, an adhesion (not shown) is utilized to fastened the embedded chip 500 in the second substrate 200.

Reference is made to FIG. 4A. A plurality of sub-substrates such as the first sub-substrate 301, the second sub-substrate 302, the third sub-substrate 303, the fourth sub-substrate 304, and the fifth sub-substrate 305 are provided. The CTE of each of the sub-substrates is less than the second CTE of the second substrate 200 (as shown in FIG. 3D). Then, a plurality of vias 310A are formed in the sub-substrates, respectively. The vias 310A can be formed by performing a laser drilling process, a deep reactive ion etching (DRIE) process, other suitable technique, or the combinations thereof.

Reference is made to FIG. 4B. The conductive vias 310 are formed in the aforementioned sub-substrates, respectively. For example, the conductive vias 310 are formed in the first sub-substrate 301, the second sub-substrate 302, the third sub-substrate 303, the fourth sub-substrate 304, and the fifth sub-substrate 305. The conductive vias 310 can be formed by performing an evaporation process, a sputtering process, a chemical plating process, an electroplating process, other suitable deposition process, or the combinations thereof.

Reference is made to FIG. 4C. The sub-substrates are laterally assembled and become the third substrate 300. For example, the first sub-substrate 301, the second sub-substrate 302, the third sub-substrate 303, the fourth sub-substrate 304, and the fifth sub-substrate 305 are laterally assembled and become the third substrate 300. A adhesion 330 is filled in the space between the adjacent sub-substrates, than a pressing process is performed to combine the sub-substrates. The material of the adhesion 330 can be epoxy, polyimide (PI), polyurethane (PU), or other suitable material. In some embodiments, the material of the adhesion 330 can be formed by curing a flowable sealant material. By using the flowability of the flowable sealant material, the adhesion 330 can fully fill the space between the adjacent sub-substrates.

In some embodiments, a polishing process is performed after laterally assembling the first sub-substrate 301, the second sub-substrate 302, the third sub-substrate 303, the fourth sub-substrate 304, and the fifth sub-substrate 305 as the third substrate 300. Therefore, the top surfaces of the sub-substrates are coplanar to ensure the security of the following chip mounting process on the third substrate 300.

Reference is made to FIG. 4D. Dielectric layers 320 and redistribution layers (not shown in this drawing and will be discussed later) are formed on the top surface and the bottom surface of the third substrate 300, in which the redistribution layers are formed within the dielectric layers 320. Each of the dielectric layers can be a single layer or multilayer structure. The dielectric material of the dielectric layers 320 can be polymeric or non-polymeric dielectric materials such as, but not limited to, liquid crystal polymer (LCP), bismaleimide-triazine (BT), prepreg, Ajinomoto build-up film (ABF), epoxy, polyimide (PI), or other suitable dielectric materials. But the disclosure is not limited thereto. In some embodiments, the dielectric material of the dielectric layers 320 can be photoimageable or photoactive dielectric material.

The dielectric layers 320 cover the third substrate 300. That is, in the embodiment illustrated in FIG. 4D, the dielectric layers 320 cover the first sub-substrate 301, the second sub-substrate 302, the third sub-substrate 303, the fourth sub-substrate 304, and the fifth sub-substrate 305 simultaneously. Therefore, the dielectric layers 320 further bind the sub-substrates of the third substrate 300 together to ensure the structural reliability of the third substrate 300. In some embodiments, the material of the adhesion 330 is the same as the material of the dielectric layers 320 such that the CTE of the adhesion 330 matches the CTE of the dielectric layers 320 thereby reducing the possibility of warpage.

Reference is made to FIG. 4E. The first chip 401, the second chip 402, the third chip 403, the fourth chip 404, and the fifth chip 405 are mounted on the third substrate 300. In some embodiments, the first chip 401, the second chip 402, the third chip 403, the fourth chip 404, and the fifth chip 405 are mounted on the corresponding sub-substrate. The arrangements and the CTE correlations of the chips and the corresponding sub-substrate of the third substrate 300 are the same as the aforementioned discussion and are not repeated herein.

Reference is made to FIG. 5. The second substrate 200 and the third substrate 300 are vertically assembled on the first substrate 100, in which the second substrate 200 is disposed between the third substrate 300 and the first substrate 100. More particularly, the structure of FIG. 3D and the structure of FIG. 4E are stacked on the first substrate 100. The embedded chip 500 embedded in the second substrate 200 has an active surface, and the active surface of the embedded chip 500 faces the substrate having a smaller CTE. In some embodiments, the active surface of the embedded chip 500 is placed facing the third substrate 300 (e.g. facing the first sub-substrate 301), then the vertically assembly is processed to complete the manufacturing of the package structure 1.

Reference is made to FIG. 6A to FIG. 6F, which are cross-sectional views of different stages of vertically assembling process of manufacturing the package structure 1 according to some embodiments of the disclosure.

Figure 6A:
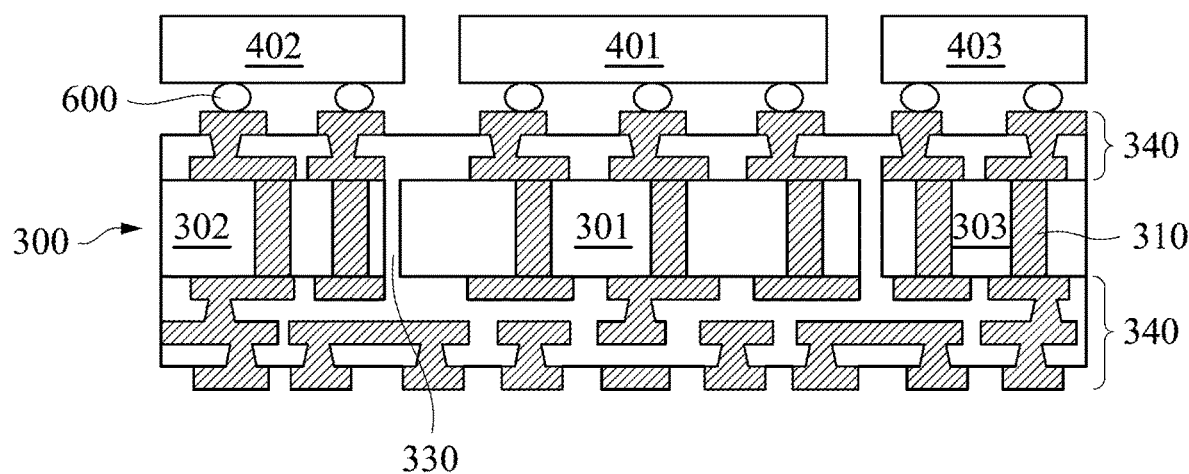
FIG. 6A to FIG. 6F are cross-sectional views of different stages of vertically assembling process of manufacturing the package structure according to some embodiments of the disclosure.

First, as shown in FIG. 6A, a plurality of sub-substrates such as the first sub-substrate 301, the second sub-substrate 302, and the third sub-substrate 303 are laterally assembled as the third substrate 300. The adhesion 330 is filled in the space between the adjacent sub-substrates, and the pressing process is performed to combine the aforementioned sub-substrates as a whole. Among the sub-substrates of the third substrate 300, the first sub-substrate 301 has a greatest CTE. The CTE of the first sub-substrate 301 is greater than the CTE of the second sub-substrate 302 and is greater than the CTE of the third sub-substrate 303. The second sub-substrate 302 and the third sub-substrate 303 are arranged laterally surrounding the first sub-substrate 301.

The stage of FIG. 6A further includes disposed a plurality of chips such as the first chip 401, the second chip 402, and the third chip 403 on the top surfaces of the first sub-substrate 301, the second sub-substrate 302, and the third sub-substrate 303, respectively. The first chip 401 may have a greatest CTE among the chips. That is, the CTE of the first chip 401 is greater than the CTE of the second chip 402 and is greater than the CTE of the third chip 403.

In some embodiments, the redistribution layers 340 are formed on opposite surfaces of the first sub-substrate 301, the second sub-substrate 302, and the third sub-substrate 303. The redistribution layers 340 are electrically coupled to the conductive vias 310 in the first sub-substrate 301, the second sub-substrate 302, and the third sub-substrate 303. The first chip 401, the second chip 402, and the third chip 403 are mounted to the redistribution layer 340 through solders 600. The first chip 401, the second chip 402, and the third chip 403 are further electrically coupled to the corresponding the first sub-substrate 301, the second sub-substrate 302, and the third sub-substrate 303 through the redistribution layer 340.

Figure 6B:
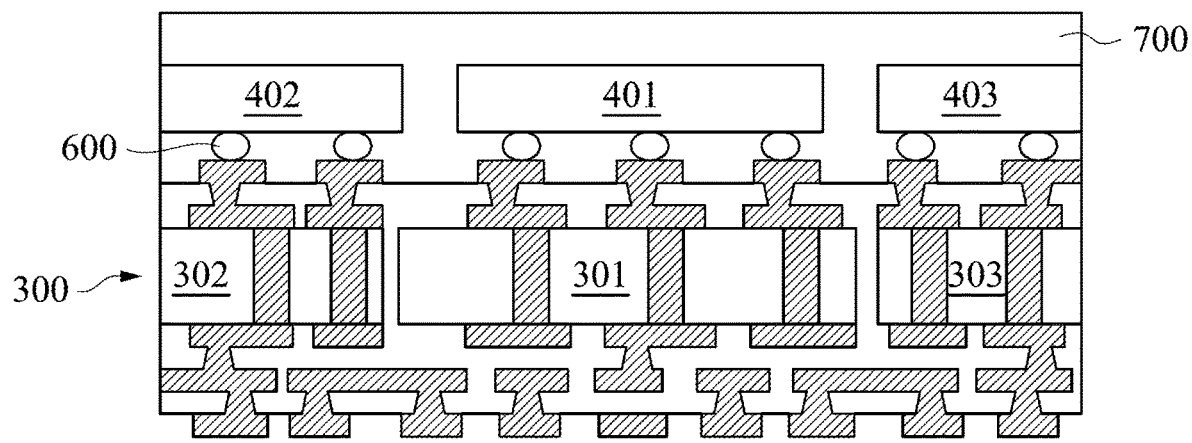

Then, as shown in FIG. 6B, the molding underfill 700 is filled into the space between the chips and the sub-substrates. The molding underfill 700 can be flowable sealant material such as epoxy and any other additives, phenolic resin, silicon molding, coupling agents, etc. By using the flowability of the flowable sealant material, with additional thermal pressing processes, the molding underfill 700 can fully fill the space between adjacent chips and the space between the solders 600. The flowable sealant material of the molding underfill 700 is cured to bind the third substrate 300 to the first chip 401, the second chip 402, and the third chip 403.

Figure 6C:
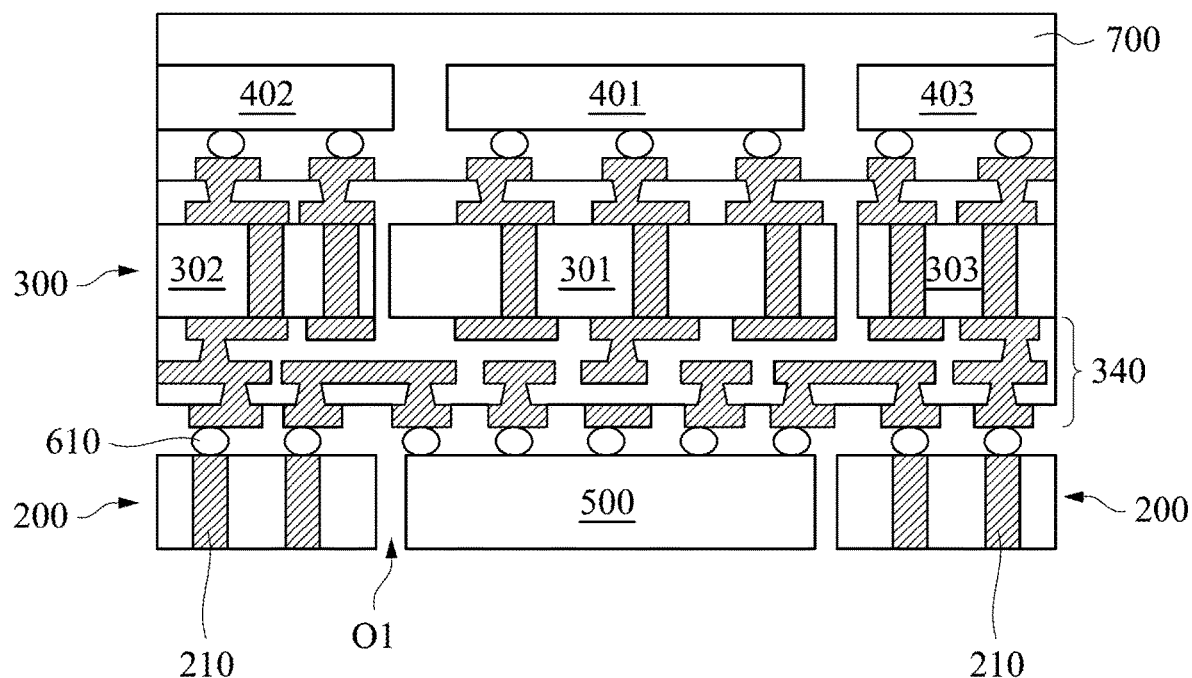

Then, as shown in FIG. 6C, an additional chip and an additional substrate are placed on the bottom surface of the third substrate 300. For example, the second substrate 200 having the opening O1 is bond on the bottom surface of the third substrate 300, and solders 610 are utilized to electrically couple the conductive vias 210 of the second substrate 200 to the redistribution layer 340 on the third substrate 300. The embedded chip 500 is placed in the opening O1 of the second substrate 200 and is electrically coupled to the redistribution layer 340 on the third substrate 300 through the solders 610. The embedded chip 500 and the second substrate 200 are coupled to the redistribution layer 340 through the solders 610, and then further electrically coupled to the corresponding first sub-substrate 301, the second sub-substrate 302, and the third sub-substrate 303 through the redistribution layer 340.

Figure 6D:
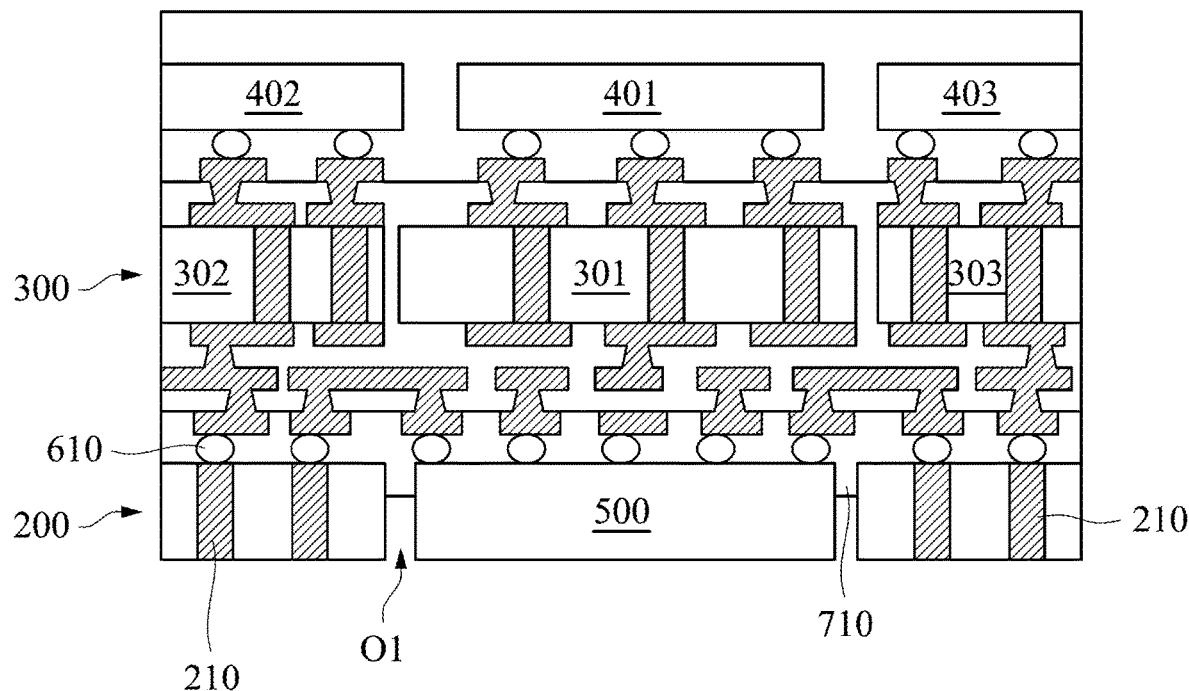

Then, as shown in FIG. 6D, a molding underfill 710 is filled into the space between the third substrate 300, the embedded chip 500, and the second substrate 200. The molding underfill 710 can be a flowable sealant material. With additional thermal pressing processes, the molding underfill 710 can fully fill the space between the solders 610. The flowable sealant material of the molding underfill 710 is cured to bind the third substrate 300, the embedded chip 500, and the second substrate 200.

In some embodiments, the molding underfill 710 does not fully fill the space between the third substrate 300, the embedded chip 500, and the second substrate 200. That is, the opening O1 is not completely filled by the molding underfill 710. Thus the molding underfill 710 is concaved between the embedded chip 500 and the second substrate 200, and the conductive vias 210 of the second substrate 200 are exposed from the molding underfill 710.

Figure 6E:
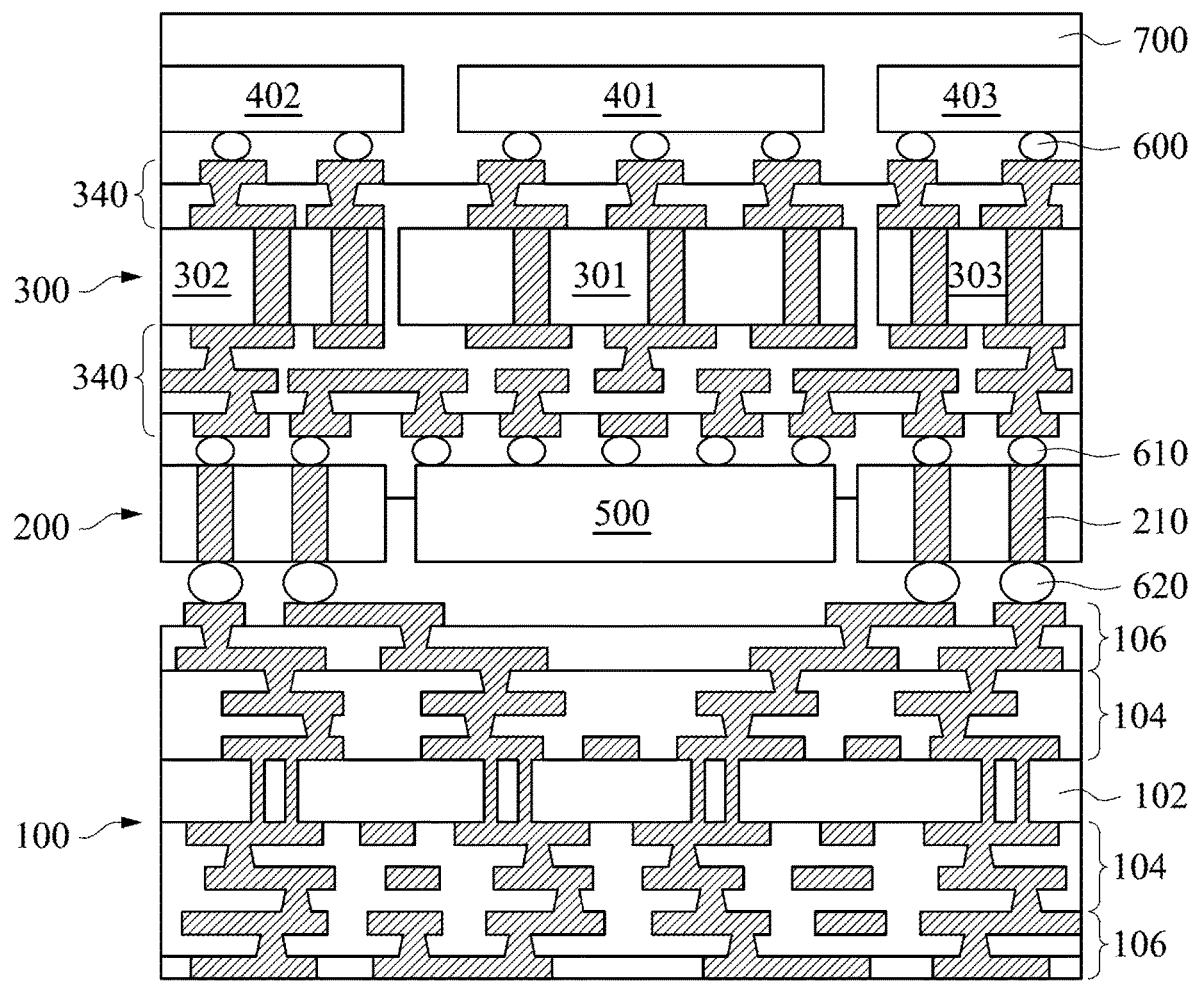

Then, as shown in FIG. 6E, the first substrate 100 is connected to the second substrate 200. More particularly, the first substrate 100 includes a core substrate 102, a plurality of build-up layer structures 104 disposed on opposite sides of the core substrate 102, and a plurality of redistribution layers 106 on the build-up layer structures 104. The second substrate 200 is connected to the redistribution layer 106 of the first substrate 100 through solders 620.

The first substrate 100 is connected to the conductive vias 210 of the second substrate 200 through the solders 620. The conductive vias 210 of the second substrate 200 are further connected to the corresponding sub-substrates of the third substrate 300 through the solders 610. The third substrate 300 is further connected to the first chip 401, the second chip 402, and the third chip 403 through the solders 600.

Figure 6F:
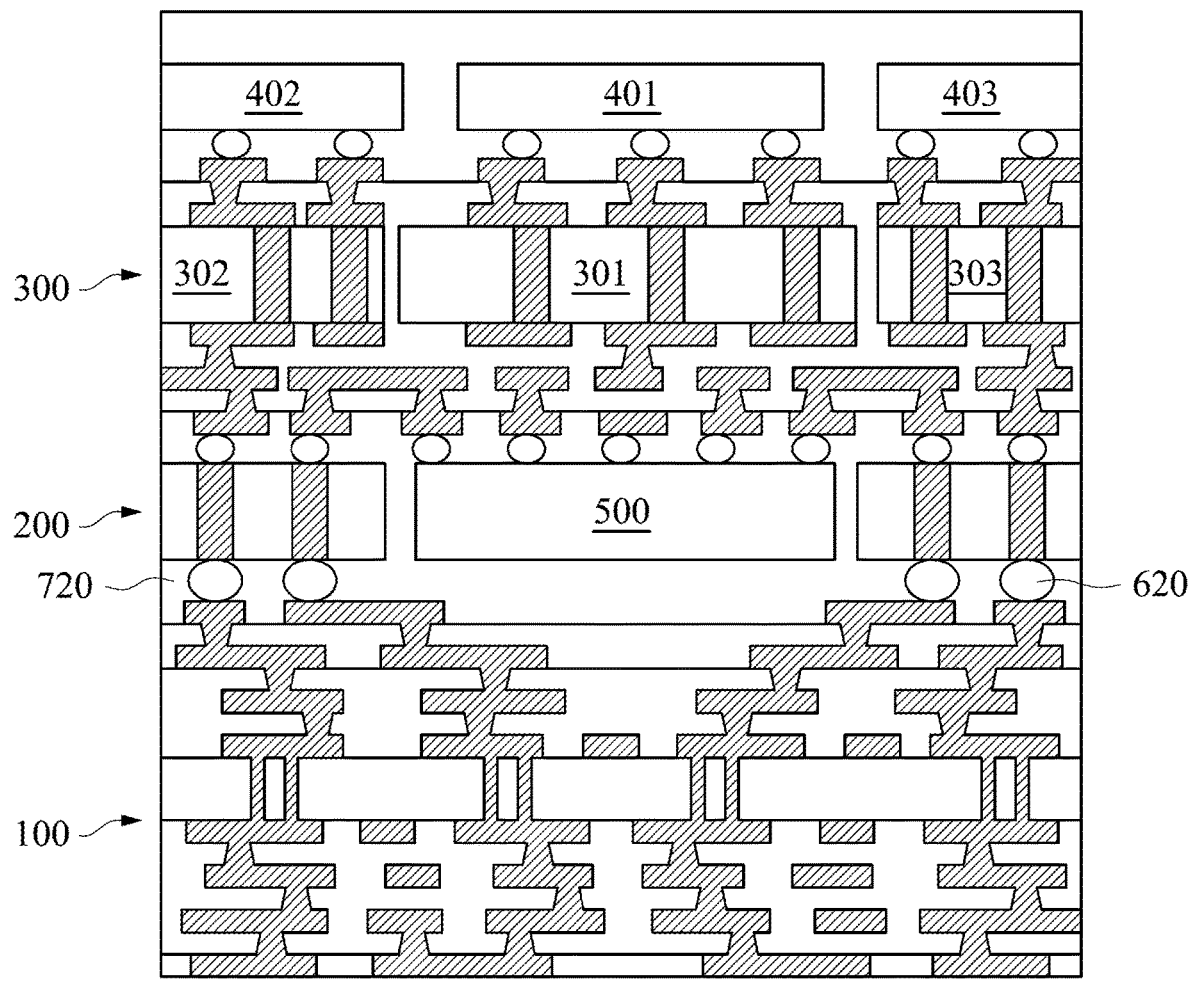

Finally, as shown in FIG. 6F, a molding underfill 710 fills the space between the first substrate 100 and third substrate 300 again. The molding underfill 710 fully fills the space between the embedded chip 500 and the second substrate 200 and fills the space between the solders 620 thereby completing the package of the package structure 1.

Figure 7:
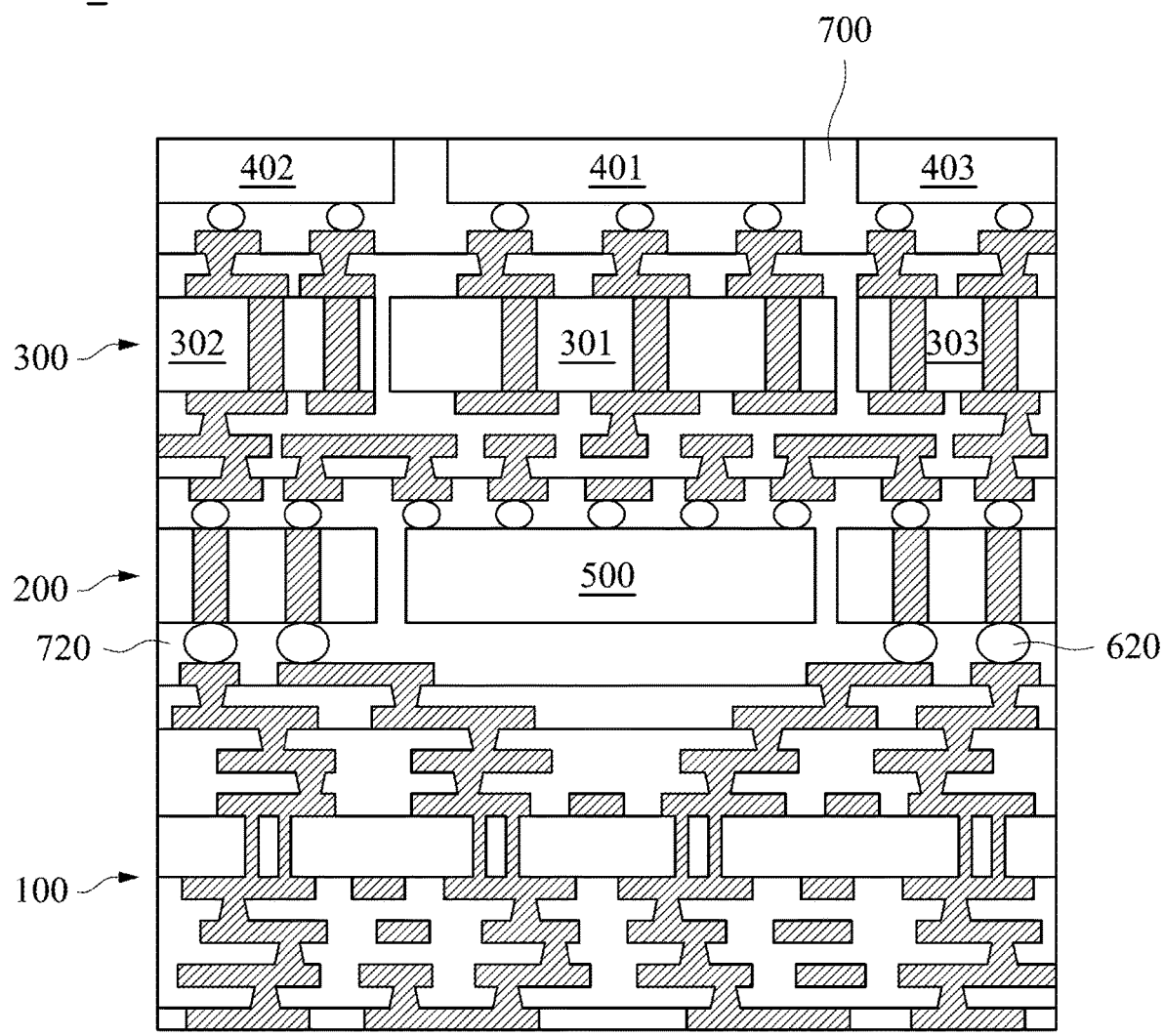
FIG. 7 is a cross-sectional view of the package structure according to some other embodiments of the disclosure.

Reference is made to FIG. 7. FIG. 7 is a cross-sectional view of the package structure 3 according to some other embodiments of the disclosure. In some other embodiments, additional chemical mechanical polishing (CMP) process is optionally performed to remove a portion of the molding underfill 700 thereby exposing the top surfaces of the first chip 401, the second chip 402, and the third chip 403. The top surfaces of the first chip 401, the second chip 402, and the third chip 403 are coplanar with the top surface of the molding underfill 700, as illustrated in the package structure 3 of FIG. 7.

Figure 8:
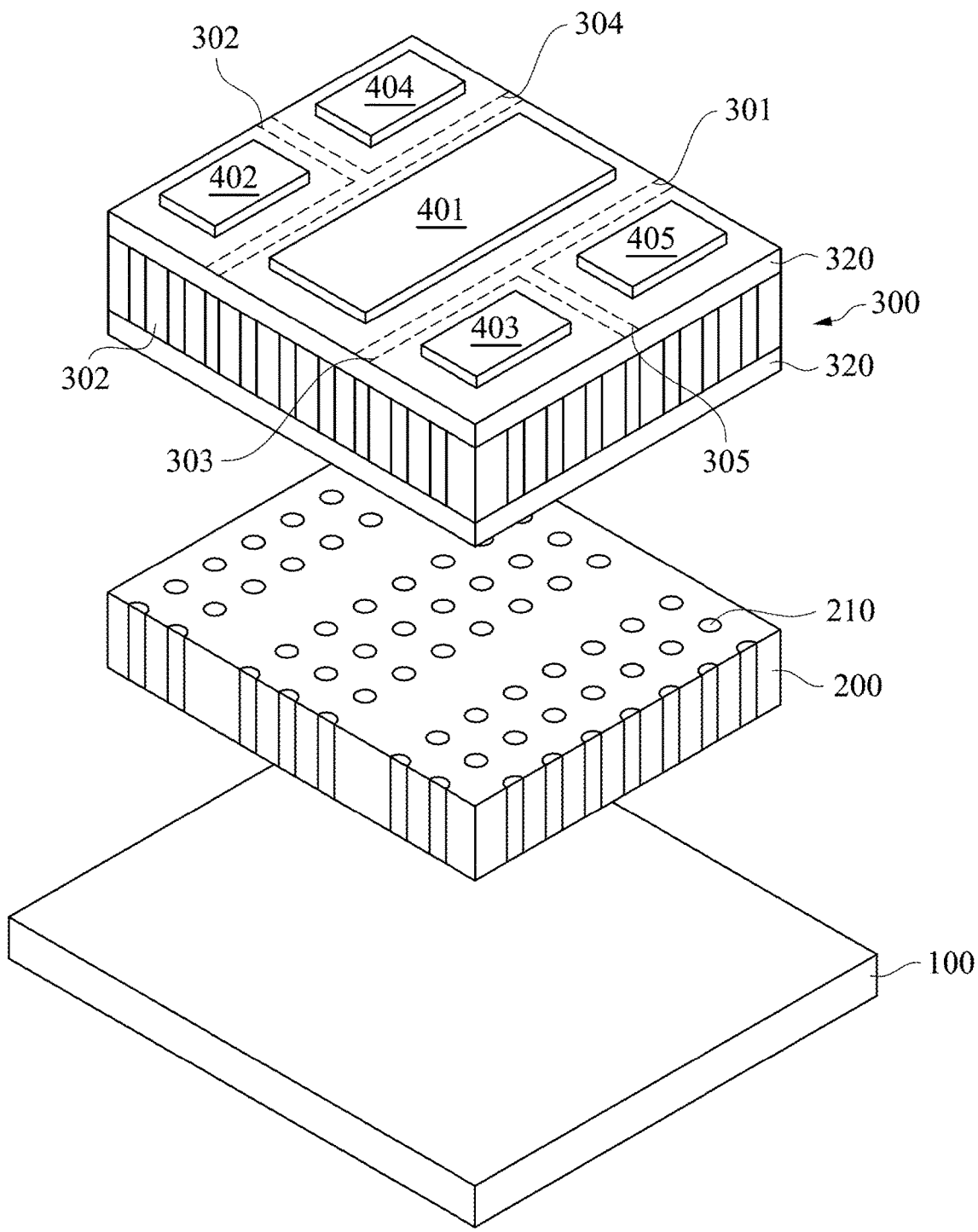
FIG. 8 is a schematic view of a stage of manufacturing the package structure according to some embodiments of the disclosure.

Reference is made to FIG. 8. FIG. 8 is a schematic view of a stage of manufacturing the package structure 4 according to some embodiments of the disclosure. The package structure 4 in FIG. 8 is much similar to the package structure 1 in FIG. 5, and the main difference therebetween is that the package structure 4 does not include the embedded component in the second substrate 200. For example, the package structure 4 does not include the embedded chip 500 (as shown in FIG. 5).

The formation of the second substrate 200 without the embedded component is discussed in the operations of FIG. 3A and FIG. 3B. That is, after the conductive vias 210 are formed in the second substrate 200, the process of vertically assembling the first substrate 100, the second substrate 200, and the third substrate 300 is performed. The process of vertically assembling the package structure 4 can refer to the operation discussed in FIG. 6A to FIG. 6F thus the operations thereof are not repeated.

The embodiments of the disclosure provide a package structure and the manufacturing method thereof. By stacking (e.g. vertically assemble) substrates with different CTEs, the CTE difference between adjacent two of the substrates is less than the CTE difference between the topmost substrate and the bottommost substrate, thereby reducing the gaps of CTE mismatch in the package structure, in order to prevent the problem of warpage in the package structure. Additionally, plural sub-substrates with different CTEs can be coupled (e.g. laterally assemble) as a substrate, and the CTEs of the sub-substrates are decided according to the CTEs of the corresponding chips. Therefore, the problem of warpage in the package structure can be further reduced, and the package density of the package structure can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure comprising:
   a first substrate having a first coefficient of thermal expansion (CTE);
   a second substrate disposed on the first substrate and having a second CTE, wherein the second CTE is smaller than the first CTE;
   a third substrate disposed on the second substrate and comprising:
   a first sub-substrate;
   a second sub-substrate located in a same level with the first sub-substrate; and a third sub-substrate located in the same level with the first sub-substrate, wherein a CTE of the first sub-substrate, a CTE of the second sub-substrate, and a CTE of the third sub-substrate are all less than the second CTE of the second substrate; and a plurality of chips disposed on the third substrate.

2. The package structure of claim 1, further comprising:
a redistribution layer disposed on the third substrate and connected to the first sub-substrate, the second sub-substrate, and the third sub-substrate.

3. The package structure of claim 1, wherein the chips comprise a first chip, a second chip, and a third chip;
a CTE of the first chip is greater than a CTE of the second chip;
the CTE of the first chip is greater than a CTE of the third chip;
the CTE of the first sub-substrate is greater than the CTE of the second sub-substrate;
the CTE of the first sub-substrate is greater than the CTE of the third sub-substrate;
the first sub-substrate is laterally surrounded by the second sub-substrate and the third sub-substrate; and
the first chip is disposed on the first sub-substrate.

4. The package structure of claim 3, wherein the CTE of the second chip is greater than the CTE of the third chip;
the CTE of the second sub-substrate is greater than the CTE of the third sub-substrate;
the second chip is disposed on the second sub-substrate; and
the third chip is disposed on the third sub-substrate.

5. The package structure of claim 3, further comprising an embedded chip embedded in the second substrate, wherein the first sub-substrate is disposed between the first chip and the embedded chip.

6. The package structure of claim 5, wherein an area of the first sub-substrate is greater than an area of the first chip, and the area of the first sub-substrate is greater than an area of the embedded chip.

7. The package structure of claim 1, wherein there is a difference between CTEs of the chips and the first CTE; and
the CTE of the first sub-substrate, the CTE of the second sub-substrate, or the CTE of the third sub-substrate is 40% to 60% of the difference.

8. The package structure of claim 1, wherein there is a difference between CTEs of the chips and the first CTE; and
the second CTE is 65% to 85% of the difference.

9. The package structure of claim 1, wherein the chips comprise a first chip, a second chip, and a third chip;
a size of the first chip is greater than a size of the second chip;
the size of the first chip is greater than a size of the third chip;
a CTE of the first chip is greater than a CTE of the second chip;
the CTE of the first chip is greater than a CTE of the third chip;
the first chip is disposed on the first sub-substrate;
the second chip is disposed on the second sub-substrate; and
the third chip is disposed on the third sub-substrate.

* * * * *